(12) United States Patent
Matsumoto

(10) Patent No.: US 6,771,942 B2
(45) Date of Patent: Aug. 3, 2004

(54) RECEIVER

(75) Inventor: Yutaka Matsumoto, Fujisawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 236 days.

(21) Appl. No.: 10/117,189

(22) Filed: Apr. 8, 2002

(65) Prior Publication Data

US 2002/0119761 A1 Aug. 29, 2002

Related U.S. Application Data

(62) Division of application No. 09/809,504, filed on Jun. 3, 1998, now Pat. No. 6,373,398.

(30) Foreign Application Priority Data

Jun. 10, 1997 (JP) .............................................. 9-152418
Sep. 16, 1997 (JP) .............................................. 9-251152

(51) Int. Cl.[7] .............................................. H04B 17/02
(52) U.S. Cl. ..................................... 455/131; 455/142
(58) Field of Search .............................. 455/334, 150.1, 455/152.1, 179.1, 183.1, 195.1, 196.1, 142, 180.3, 323, 333, 335, 143, 144, 131; 331/2

(56) References Cited

U.S. PATENT DOCUMENTS

| | | | | |
|---|---|---|---|---|
| 3,976,943 A | * | 8/1976 | Cipher et al. ................ | 455/144 |
| 4,050,022 A | * | 9/1977 | McFadyen et al. .......... | 455/143 |
| 4,181,890 A | * | 1/1980 | Yamamoto ................... | 455/143 |
| 4,320,529 A | * | 3/1982 | Maeda et al. ............. | 455/158.4 |
| 4,688,264 A | * | 8/1987 | Miura ....................... | 455/168.1 |
| 5,332,978 A | * | 7/1994 | Yabuki et al. ................. | 331/2 |

FOREIGN PATENT DOCUMENTS

| | | |
|---|---|---|
| DE | PS 860 907 | 12/1952 |
| DE | 29 22 230 | 10/1980 |
| DE | 195 13 341 | 10/1996 |
| JP | 1-235784 | 9/1989 |
| JP | 5-179852 | 7/1993 |
| JP | 5-311935 | 11/1993 |
| JP | 6-67748 | 9/1994 |
| JP | 7-131374 | 5/1995 |
| JP | 7-33039 | 6/1995 |
| JP | 7-246915 | 9/1995 |
| JP | 9-113594 | 5/1997 |

* cited by examiner

*Primary Examiner*—Vivian Chin
*Assistant Examiner*—Lewis G. West
(74) *Attorney, Agent, or Firm*—Oblon, Spivak, McClelland, Maier & Neustadt, P.C.

(57) ABSTRACT

In a receiver, either an FM/AM signal to be used for a keyless entry system or a high frequency signal to be used for an automobile audio system for FM broadcast is applied to a first converter. An IF limiter amplifier amplifies the output signal of the converter and subsequently limits the amplitude of the output signal to a predetermined level. An FM detector circuit FM-detects the output signal of the IF limiter amplifier. A stereophonic demodulation circuit demodulates the output signal of the detector circuit. A high frequency signal for AM broadcast is fed to an IF amplifier by way of a second converter. Either the output signal of the IF limiter amplifier or that of the IF amplifier is applied to an AM detector circuit. The keyless entry system is adapted to lock and unlock the door of the automobile on the basis of the FM keyless signal output from the FM detector circuit and the automobile audio system is adapted to operate for FM broadcast on the basis of the FM radio signal output from the stereophonic demodulation circuit.

6 Claims, 13 Drawing Sheets

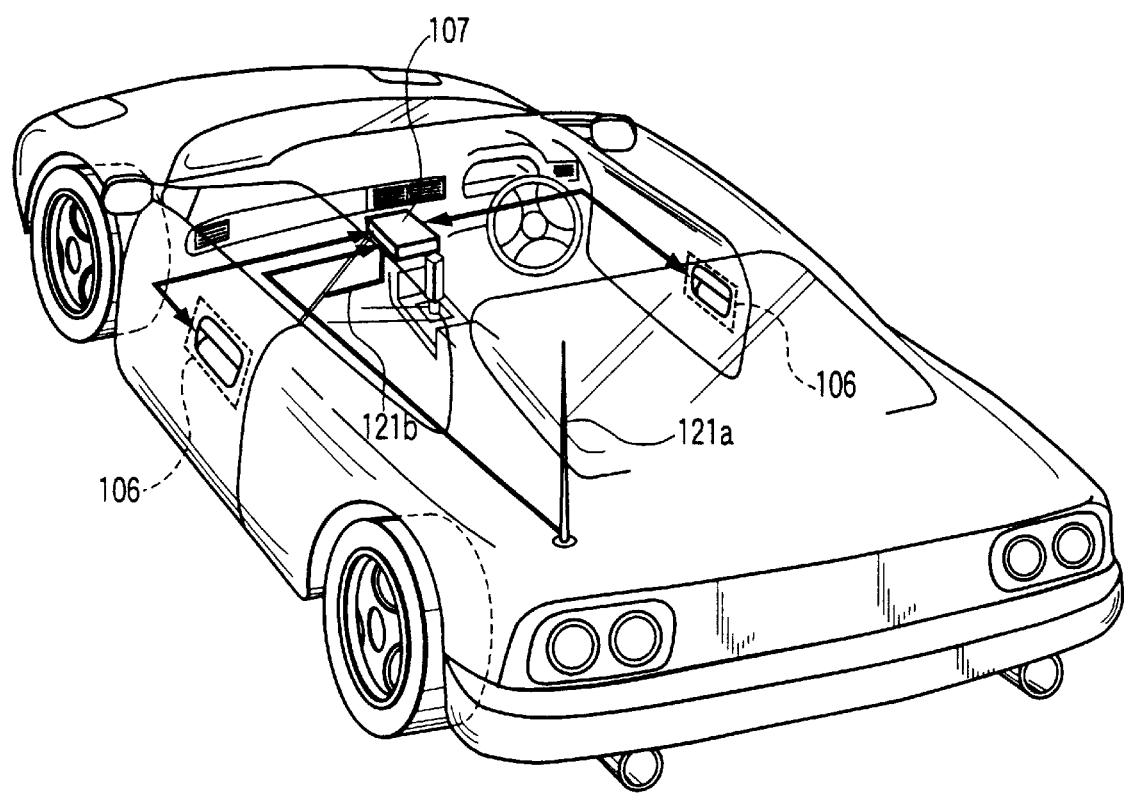
F I G. 9

RECEIVER

This application is a division of application Ser. No. 09/089,504 filed on Jun. 3, 1998, now U.S. Pat. No. 6,373,398.

BACKGROUND OF THE INVENTION (1) In an aspect, this invention relates to a receiver and, more particularly, to a receiver applicable to an automobile audio tuner system.

The trend of electronization of automobiles seems to be practically limitless. In recent years, a so-called keyless entry system has become popular to allow the automobile driver to remotely lock and unlock the door of the automobile.

FIG. 1 of the accompanying drawing is a schematic block diagram of the tuner section of a known keyless entry system.

Referring to FIG. 1, tuner 100 comprises an RF (radio frequency) amplifier 102 and a keyless signal generating circuit 103, wherein a signal wave is emitted from the door key as a switch arranged at the door key 104 is depressed. The signal wave is then entered to the RF amplifier 102 by way of an antenna 101 arranged near the transmission system or the fender of the car. The signal wave is then amplified by the RF amplifier 102 for high frequency amplification. The keyless signal generating circuit 103 generates a keyless signal according to the output signal of the RF amplifier 102.

The keyless signal is then entered to microcomputer 105 of the keyless entry system. Upon receiving the keyless signal, the microcomputer 105 controls the door lock for locking and unlocking the door. More specifically, the microcomputer 105 recognizes the status of door lock mechanism 106 of the automobile so that it unlocks the door when it receives a keyless signal while the door is held in a locked state by the door lock, whereas it locks the door when it receives a keyless signal while the door is held in an unlocked state by the door lock.

The tuner of a keyless entry system is either of an FM tuner system that utilizes FM signals or of an AM tuner system that utilizes AM signals.

Referring to FIG. 2 of the accompanying drawing, the keyless signal generating circuit 103 of an FM tuner system typically comprises a converter $103_3$ for frequency conversion including a mixer $103_1$ and an oscillator circuit (OSC) $103_2$, an IF (intermediate frequency) limiter amplifier $103_4$ and an FM detector circuit $103_5$.

Referring to FIG. 3 of the accompanying drawings, the keyless signal generating circuit 103 of an AM tuner system, on the other hand, typically comprises a converter $103_8$ for frequency conversion including a mixer $103_6$ and an oscillator circuit (OSC) $103_7$, an IF amplifier provided with an AGC (automatic gain control) function and an AM detector circuit $103_{10}$.

Meanwhile, an automobile is provided with an mobile radio receiving set as a standard or optional equipment. Such a mobile radio receiving set comprises an FM (frequency modulation) tuner and an AM (amplitude modulation) tuner.

FIG. 4 of the accompanying drawing is a schematic block diagram of the FM/AM tuner section of a mobile radio receiving set.

Referring to FIG. 4, the tuner 200 comprises an RF antenna for FM broadcast, a regenerative circuit 203 for FM broadcast and a stereophonic demodulation circuit 204.

The FM tuner section of the tuner 200 includes an RF amplifier 202 for FM broadcast, a regenerative circuit 203 for FM broadcast and a stereophonic demodulation circuit 204. An FM wave is fed to the RF amplifier 202 for FM broadcast by way of the antenna 201. Then, the FM wave is amplified for high frequency amplification. The regenerative circuit 203 for FM broadcast generates an FM composite signal on the basis of the output signal of the RF amplifier 202 for FM broadcast. The stereophonic demodulation circuit 204 generates a left/right signal for FM broadcast on the basis of the FM composite signal.

Referring to FIG. 5 of the accompanying drawing, the regenerative circuit 203 for FM broadcast typically comprises a converter $203_3$ for frequency conversion including a mixer $203_1$ a VCO $203_2$ for FM broadcast, an IF limiter amplifier $203_4$ and an FM detector circuit $203_5$.

The stereophonic demodulation circuit 204 typically includes a pulse noise reduction circuit and a stereophonic decoder.

The AM tuner section of the tuner 200, on the other hand, includes an RF amplifier 205 for AM broadcast and a regenerative circuit 206 for AM broadcast. An AM wave is fed to the RF amplifier 205 for AM broadcast by way of the antenna 201. Then, the AM wave is amplified by the RF amplifier 205 for AM broadcast. The regenerative circuit 206 for AM broadcast generates an AM radio signal on the basis of the output signal of the RF amplifier 205 for AM broadcast.

As shown in FIG. 6 of the accompanying drawing, the regenerative circuit 106 for AM broadcast typically comprises a converter $203_8$ for frequency conversion including a mixer $203_6$ and a VCO $203_7$ for AM broadcast, an IF amplifier $203_9$ having an AGC (automatic gain control) function and an AM detector circuit $203_{10}$.

As seen from the above description, the known keyless entry system and the automobile audio system have respective histories of technological development. One of the reasons for this may be that the reception frequency (about 300 MHz to 430 MHz) of the tuner of any known keyless entry system is higher than those of the MW band and the VHF band used for the FM/AM tuner of any existing automobile audio system. Therefore, the tuner section of the keyless entry system and the FM/AM tuner section of the automobile audio system have respective configurations that are different from each other in an automobile.

However, referring to FIG. 7 of the accompanying drawings, the signal wave is typically used digitally to express the existence of a signal ("1") and the nonexistence of a signal ("0") in an AM tuner type keyless entry system for both transmission and reception. If such is the case, the tuner section may not need an AGC function because the tuner section can process the received signal wave without distortion.

Therefore, the IF amplifier of an AM tuner type keyless entry system may be replaced by a limiter amplifier that is normally used in an FM tuner type keyless entry system.

Additionally, a keyless entry system comprises and an automobile audio system have components that are common in both of them.

Thus, it is an object of the present invention to provide a tuner section that can be used commonly for a keyless entry system and an automobile audio system in order to reduce the number of components in an automobile equipped with a keyless entry system and hence the manufacturing cost such a keyless entry system.

(2) In another aspect, the present invention relates to a crystal oscillator and, more particularly, it relates to a crystal oscillator to be suitably used for generating a master clock for the tuner and the station selecting PLL (phase locked loop) circuit of a radio or a television receiver.

FIG. 8 of the accompanying drawing is a schematic block diagram of a principal part of a known radio receiver.

The radio receiver comprises an FM tuner, an AM tuner and a PLL circuit.

The FM tuner includes an RF (radio frequency) amplifier 11, a mixer 12 and a band-pass filter 13.

The high frequency signal caught by the antenna 10 of the radio receiver is fed to the RF amplifier 11 and amplified. The output of the RF amplifier 11 is sent to the mixer 12 and the PLL circuit 31 to select a station. The output of the mixer 12 is turned into an IF (intermediate frequency) signal as it passes through the band-pass filter 13.

The AM tuner includes an RF amplifier 21, mixers 22a and 22b, band-pass filters 23a and 23b and a crystal oscillator 24.

The high frequency signal received by the antenna 10 is sent to the RF amplifier 21 and amplified. The output of the RF amplifier 21 is sent to the mixer 22a to select a station. The output of the mixer 22a is sent to the mixer 22b by way of the PLL circuit 23a and subjected to frequency conversion in the mixer 22b. The mixer 22b is fed with the clock generated by the crystal oscillator 24. The output of the mixer 22b is turned into an IF signal as it passes through the band-pass filter 23b.

The station selecting PLL circuit 31 includes an FM programmable divider 32a, an AM programmable divider 32b, an FM reference divider 33a, an AM reference divider 33b, a phase comparator 34, low-pass filters 35a, 35b, VCOs (voltage controlled oscillators) 36a, 36b and a crystal oscillator 37.

The crystal oscillator 37 generates a clock with a predetermined frequency and the FM reference divider 33a and the AM reference divider 33b generate signals with desired respective frequencies for selecting a station on the basis of the clock with the predetermined frequency.

With a known radio receiver having the above described configuration, the AM tuner needs a crystal oscillator dedicated to the AM tuner. For example, in a double conversion type AM tuner adapted to up-convert the received radio wave to 10.70 or 10.71 MHz and thereafter down-convert it to 450 KHz, it requires a crystal oscillator 24 dedicated to generate a clock (10.25 MHz or 10.26 MHz) to be applied to the mixer 22b.

Additionally, the station selecting PLL circuit 31 needs a crystal oscillator 37 to generate a clock with a desired frequency for selecting a station. Conventionally, the crystal oscillator of the AM tuner and that of the station selecting PLL circuit may be combined into a single unit to reduce the manufacturing cost thereof. If such is the case, the reference dividers 33a, 33b generate a clock with a desired frequency, using 10.25 MHz or 10.26 MHz.

Conventionally, the FM tuner section 32, the AM tuner section 33 and the station selecting PLL circuit 31 are formed into respective different chips. Meanwhile, in recent years, ICs including those comprising an FM tuner section 32 and an AM tuner section 33 as integral parts thereof, those comprising an FM tuner section 32 and a station selecting PLL circuit 32 as integral parts thereof and those comprising FM/AM tuner sections 32, 33 and a station selecting PLL circuit 31 as integral parts thereof have been developed.

Such one-chip ICs are remarkably advantageous in terms of reducing the manufacturing cost. An IC comprising an AM tuner section 33 and a station selecting PLL circuit 31 in a single chip is particularly advantageous because a single common crystal oscillator can be used for crystal oscillators 24 and 37 to reduce the total manufacturing cost at least by the cost of manufacturing a crystal oscillator.

In such a one-chip IC, however, the higher harmonic of 10.25 MHz or 10.26 MHz generated in the crystal oscillators 24, 37 enters the received FM band to adversely affect the signal receiving operation of the FM tuner.

BRIEF SUMMARY OF THE INVENTION (1) According to a first aspect of the invention, there is provided a receiver comprising:

a converter for performing frequency conversion on one of an FM signal to be used for a keyless entry system and a high frequency signal of FM broadcast;

an IF limiter amplifier for amplifying an output signal of the converter and subsequently limiting an amplitude of the output signal to a predetermined level;

an FM detector circuit for FM-detecting an output signal of the IF limiter amplifier; and a microcomputer for controlling the operation of locking and unlocking a door of an automobile on the basis of an FM keyless signal output from the FM detector circuit;

wherein the FM broadcast generated on the basis of a signal output from the FM detector circuit.

According to the invention, there is also provided a receiver comprising:

a first converter for performing frequency conversion on one of an FM signal to be used for a keyless entry system and a high frequency signal of FM broadcast;

an IF limiter amplifier for amplifying an output signal of the first converter and subsequently limiting an amplitude of the output signal to a predetermined level;

a second converter for performing frequency conversion on a high frequency signal of AM broadcast;

an IF amplifier provided with an AGC function for amplifying an output signal of the second converter;

an AM detector circuit for AM-detection;

a selector for applying one of an output signal of the IF limiter amplifier and an output signal the IF amplifier; and a microcomputer for controlling the operation of locking and unlocking a door of an automobile on the basis of an AM keyless signal output from the AM detector circuit;

wherein the selector selects the output signal of the IF limiter amplifier when the first converter performs frequency conversion on the AM signal and selects the output signal of the IF amplifier when the first converter performs frequency conversion on the high frequency signal for FM broadcast, and the AM broadcast generated on the basis of an AM radio signal output from the AM detector circuit.

(2) According to a second aspect of the invention, there is provided a receiver comprising:

an FM tuner having an FM mixer for converting the frequency of an FM signal;

a double conversion type AM tuner having a first AM mixer for up-converting the frequency of an AM signal and down-converting the frequency of the AM signal; and a PLL circuit having a first VCO for generating an output signal to be applied to the FM mixer on the basis of the outcome of comparing the output signal of the crystal oscillator and that of the FM mixer and a second VCO for generating an output signal to be applied to the first AM mixer on the basis of the outcome of comparing the output signal of the crystal oscillator and that of the first AM mixer;

wherein the crystal oscillator includes a first oscillation circuit, a second oscillation circuit having a loop gain higher than the first oscillation circuit and a control circuit for activating at least the second oscillation circuit for a predetermined period of time after the start and inactivating the second oscillation circuit after the predetermined period of time, while keeping the first oscillation circuit activated;

the output terminals of the first and second oscillation circuits being connected commonly and positively fed back.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 schematic perspective view of an automobile showing how some of the components of a receiver according to the invention are arranged.

DETAILED DESCRIPTION OF THE INVENTION (1) Now, a receiver according to the first aspect of the invention will be described in detail by referring to the accompanying drawing. FIGS. 9 and 10A schematically illustrate a receiver according to the invention.

Figure 1:
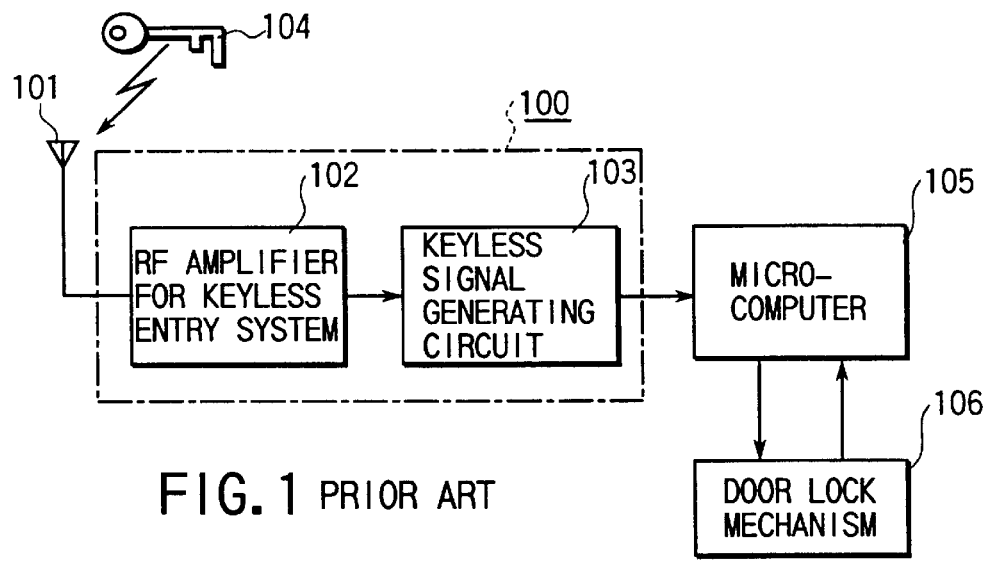
FIG. 1 is a schematic block diagram of a known keyless entry system.
Figure 2:
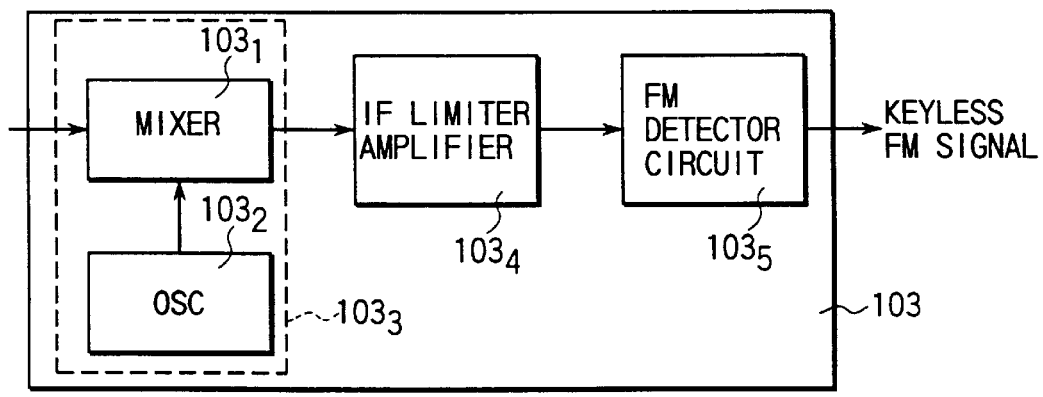
FIG. 2 is a schematic block diagram of the keyless signal generating circuit of the system of FIG. 1, which is an FM tuner type system.
Figure 3:
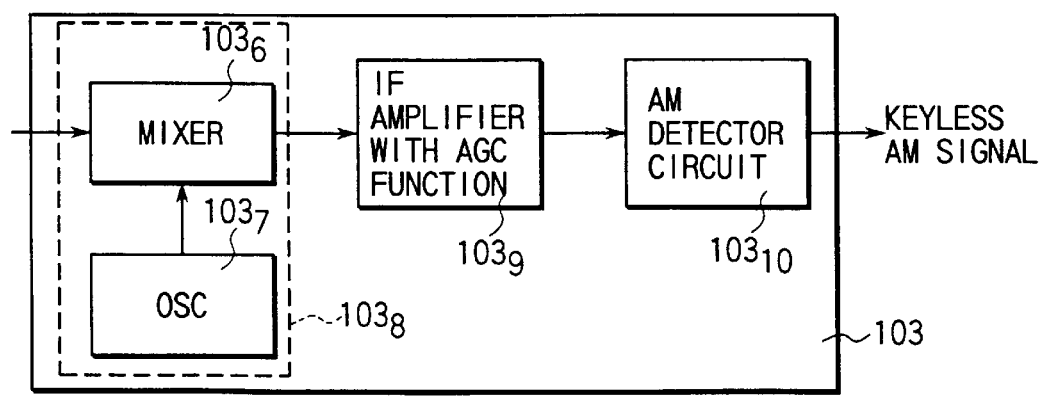
FIG. 3 is a schematic block diagram of the keyless signal generating circuit of the system of FIG. 1, which is an AM tuner type system.
Figure 4:
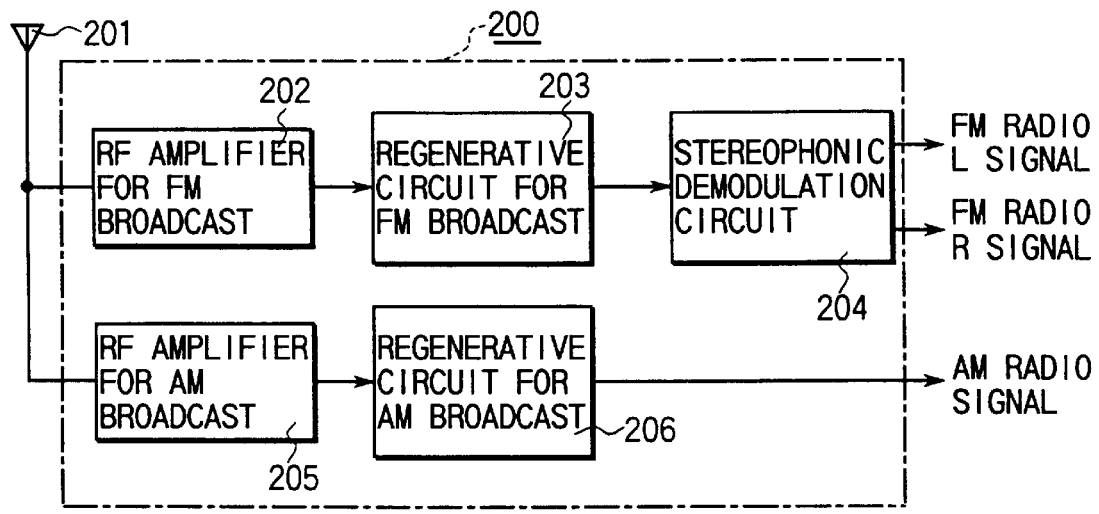
FIG. 4 is a schematic block diagram of a known automobile audio system.
Figure 5:
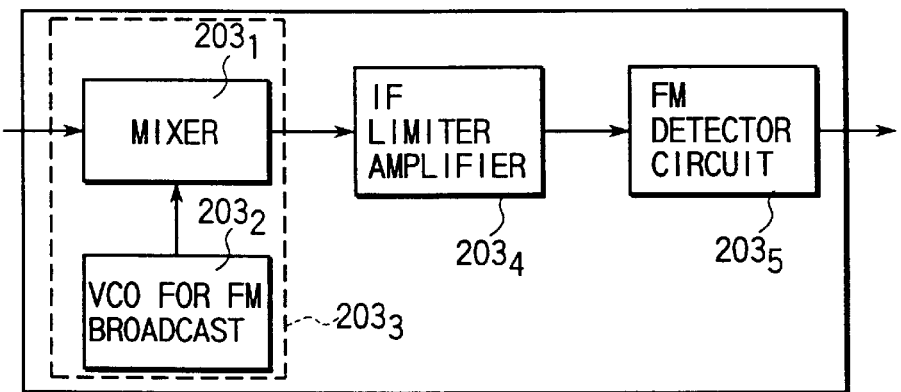
FIG. 5 is a schematic block diagram of the regenerative circuit for FM broadcast of the system of FIG. 4.
Figure 6:
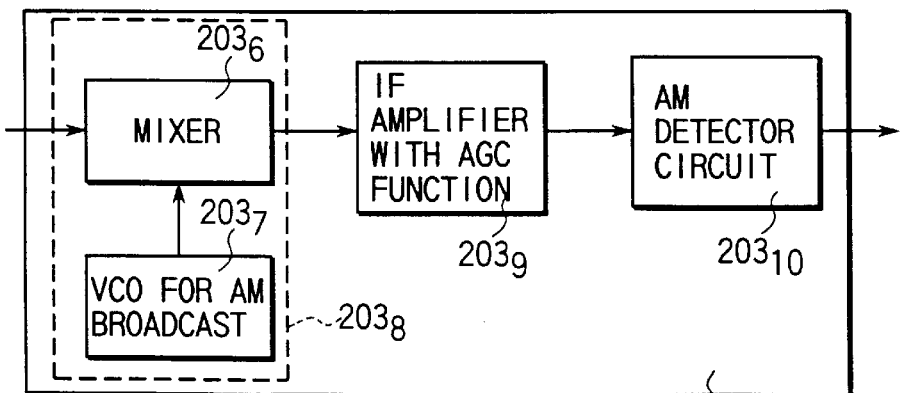
FIG. 6 is a schematic block diagram of the regenerative circuit for AM broadcast of the system of FIG. 4.
Figure 7:
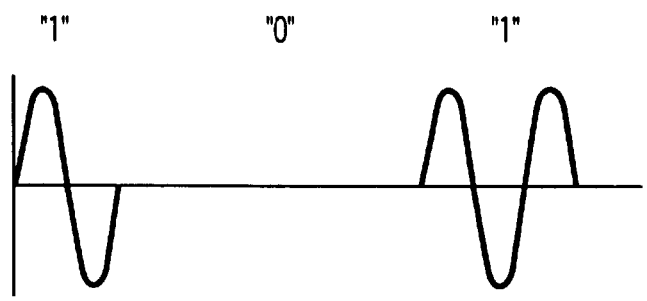
FIG. 7 is a graph showing a transmission/reception signal wave (that can be used for an AM tuner type system).
Figure 8:
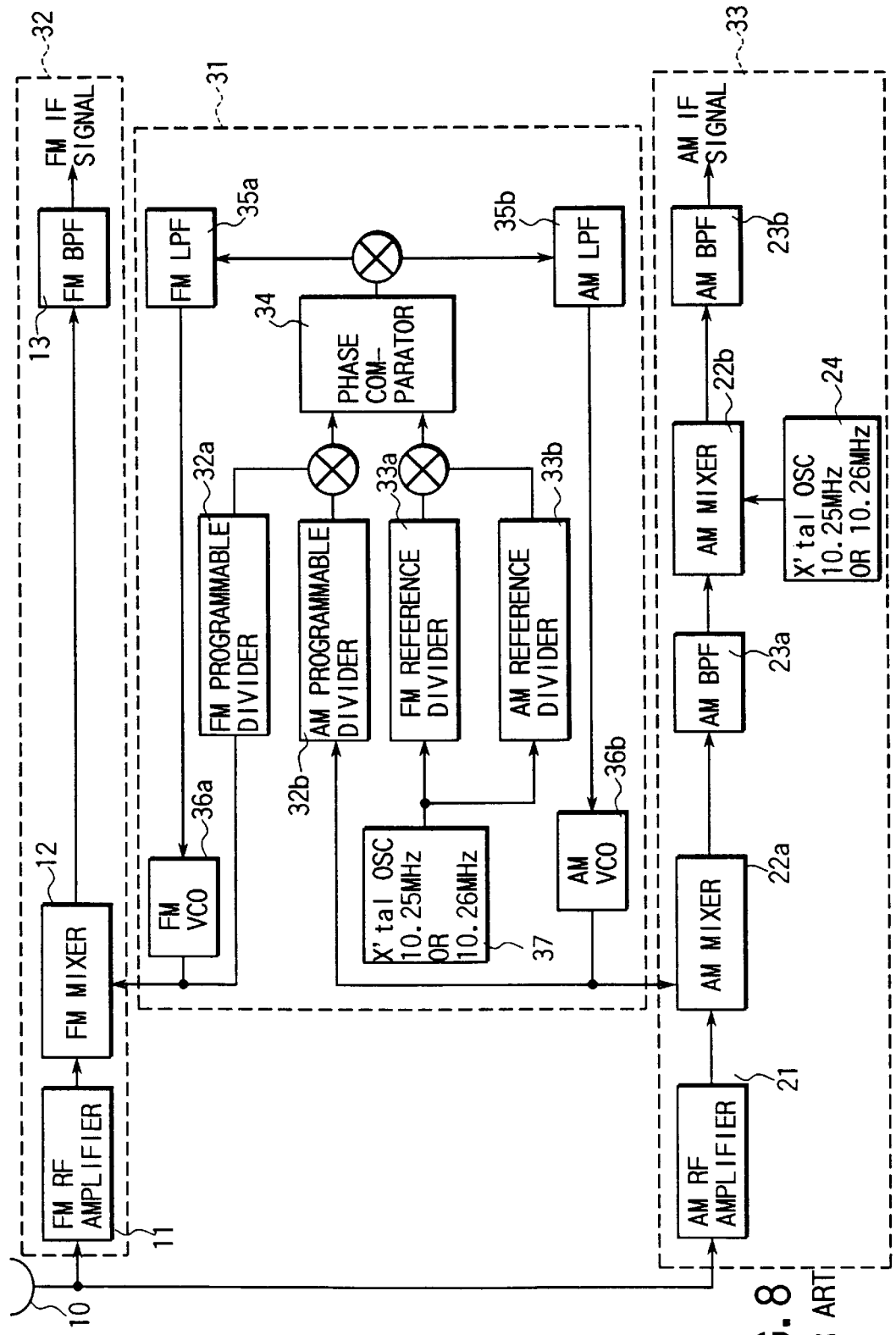
FIG. 8 is a schematic block diagram of a principal part of a known radio receiver.

A receiver according to the first aspect of the invention is realized by combining the tuner section of a keyless entry system and that of an automobile audio system into an integral unit.

The illustrated principal part of the receiver comprises an antenna 121a for receiving radio broadcast, an antenna 121b for receiving a signal wave from door key 104, an RF amplifier 122 for FM broadcast, an RF amplifier 123 for AM broadcast, an RF amplifier for the keyless entry system and a tuner section 110. The RF amplifier 122 for FM broadcast, the RF amplifier 123 for AM broadcast, the RF amplifier for the keyless entry system, the tuner section 110 and a microcomputer 105 may be assembled into a unit 107.

Figure 10A:
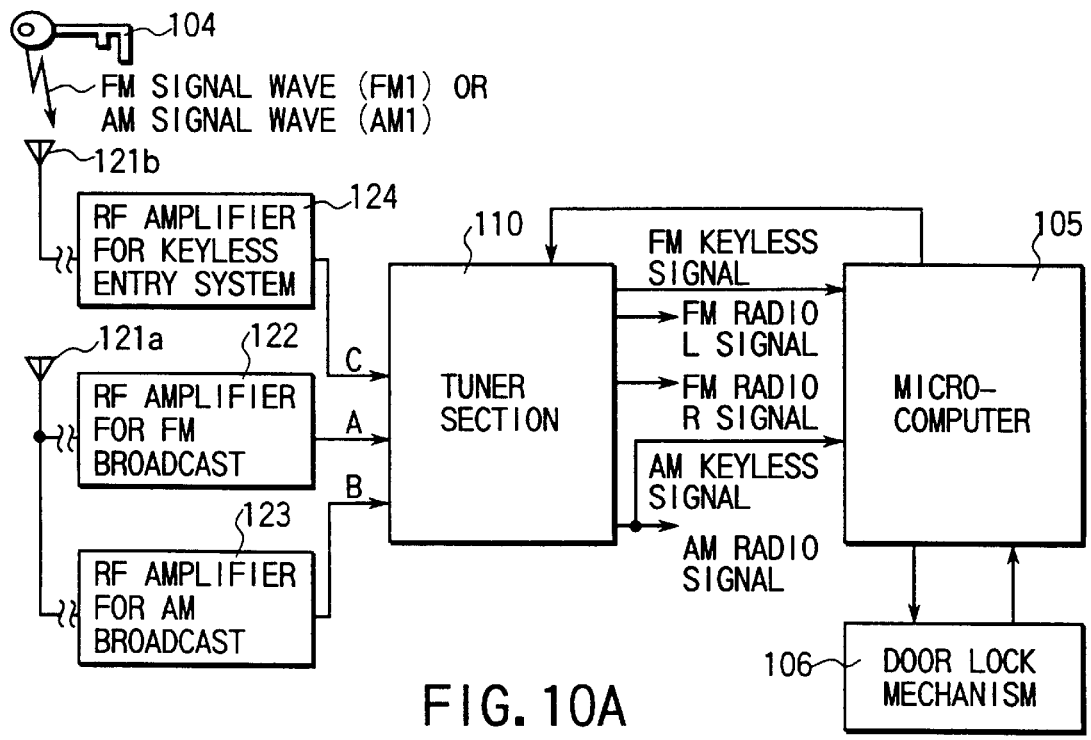
FIGS. 10A and 10B are a schematic block diagrams of two embodiments of receiver according to the invention, showing the respective circuit configurations thereof.
Figure 10B:
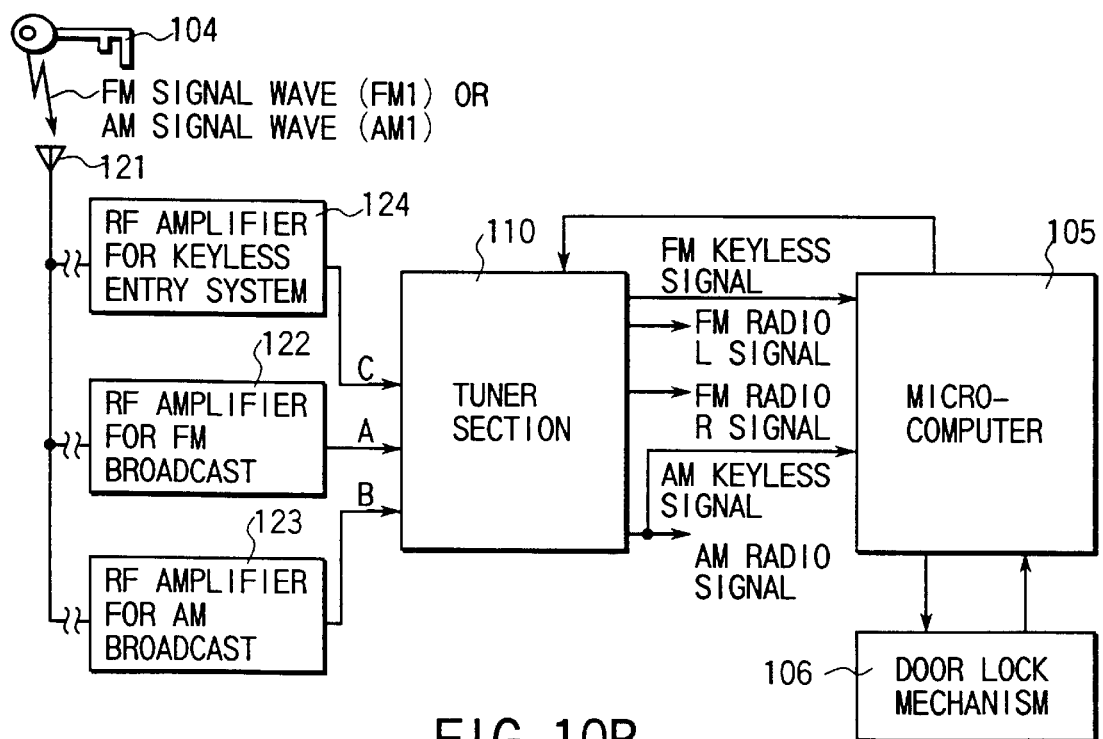

The antennas 121a and 121b may also be combined into a unit as shown in FIG. 10B. If such is the case, an ordinary antenna for receiving FM/AM broadcast may have to be modified to make its frequency characteristics adapted to also receiving FM/AM signal waves from the door key 104.

An FM wave for FM broadcast is fed to the RF amplifier 122 for FM broadcast by way of the antenna 121a. The RF amplifier 122 amplifies the FM wave for high frequency amplification. The output signal of the RF amplifier 122 is fed to the tuner section 110. Similarly, an AM wave of AM radio broadcast is fed to the RF amplifier 123 for AM broadcast by way of the amplifier 121a. The RF amplifier 123 amplifies the AM wave for high frequency amplification. The output signal of the RF amplifier 123 is fed to the tuner section 110.

On the other hand, the door key 104 is provided with a switch so that a signal wave (FM wave or AM wave) is transmitted from the door key 104 as the switch is depressed. The signal wave is then fed to the RF amplifier 124 by way of the antenna 121b that may be arranged near the transmission system or the fender of the automobile. The RF amplifier 124 amplifies the signal wave for high frequency amplification. The output signal of the RF amplifier 124 is fed to the tuner section 110.

The tuner section 110 selects either output signal A from the RF amplifier 122 for FM broadcast or output signal C from the RF amplifier 124 for the keyless entry system according to the control signal from the microcomputer 105. An FM radio L signal and an FM radio R signal will be generated when output signal A from the RF amplifier 122 for FM broadcast is selected, whereas an FM keyless signal or an AM keyless signal will be generated when the output signal C from the RF amplifier 124 for the keyless entry system is selected.

The microcomputer 105 controls the door lock mechanism 106 according to the FM keyless signal or the AM keyless signal. More specifically, the microcomputer 105 recognizes the status of door lock mechanism 106 of the automobile so that it unlocks the door when it receives an FM/AM keyless signal while the door is held in a locked state by the door lock, whereas it locks the door when it receives an FM/AM keyless signal while the door is held in an unlocked state by the door lock.

Figure 11:
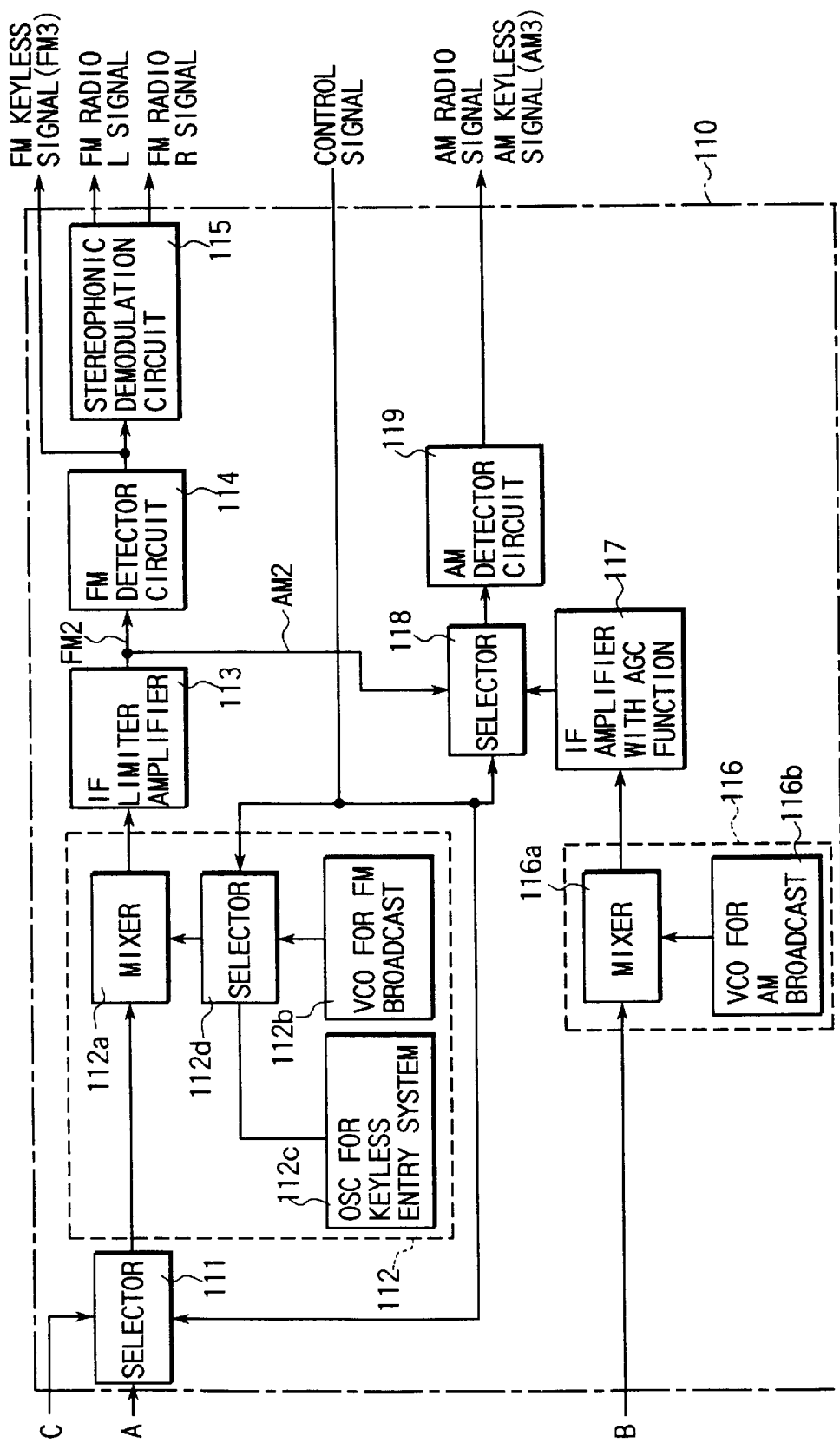
FIG. 11 is a schematic block diagram of the tuner section of either of the embodiments of FIGS. 10A and 10B.

FIG. 11 is a schematic block diagram of the tuner section of either of the embodiments of FIGS. 10A and 10B.

The tuner section comprises a selector 111, a converter 112, an IF limiter amplifier 113, an FM detector circuit 114 and a stereophonic demodulation circuit 115. The converter 112 includes a mixer 112a, a VCO 112b for FM broadcast, an OSC 112c for the keyless entry system and a selector 112d.

The selector 111 selects either output signal A of the RF amplifier for FM broadcast or output signal C of the RF amplifier for the keyless entry system according to the control signal from the microcomputer. The converter 112 converts the frequency of the output signal A of the RF amplifier for FM broadcast or that of the output signal C of the RF amplifier for the keyless entry system.

When the selector 111 selects the output signal A of the RF amplifier for FM broadcast, the selector 112d of the converter 112 selects the VCO 112b for FM broadcast. When, on the other hand, the selector 111 selects the output signal C of the RF amplifier for keyless entry system, the selector 112d of the converter 112 selects the OSC 112c for the keyless entry system.

The output signal of the converter 112 is fed to the IF limiter amplifier 113. The IF limiter amplifier 113 amplifies the output signal (IF signal) of the converter 112 to make it show a constant amplitude. The FM detector circuit 114 detects either a high frequency signal (FM composite signal) for FM broadcast or an FM keyless signal out of the output signal of the IF limiter amplifier 113. The detected FM keyless signal FM3 is then fed to the microcomputer.

The stereophonic demodulation circuit 115 demodulates the FM composite signal from the FM detector circuit 114. The output signal of the stereophonic demodulation circuit 115 is then applied to the speaker of the audio system as stereophonic signal (FM radio L signal, FM radio R signal).

The AM tuner section comprises a converter 116, an IF amplifier 117 provided with an AGC function, a selector 118 and an AM detector circuit 119. The converter 116 includes a mixer 116a and a VCO 116b for AM broadcast.

The converter converts the frequency of output signal B of the RF amplifier 123 for AM broadcast. The output signal of the converter 116 is fed to the IF amplifier 117 provided with an AGC function. The IF amplifier 117 provided with an AGC function amplifies the output signal (IF signal) of the converter 116.

The selector 118 selects either the output signal of the IF limiter amplifier of the FM tuner section or that of the IF amplifier 117 provided with an AGC function.

The AM detector circuit 119 detects either a high frequency signal for AM broadcast or an AM keyless signal according to the output signal of the IF limiter frequency 113 or that of the IF frequency 117 provided with an AGC function respectively. The detected AM keyless signal AM3 is fed to the microcomputer.

Thus, a receiver having the above described configuration is realized by partly modifying the tuner section of the automobile audio system to make it operate also as tuner section of the keyless entry system.

More specifically, the FM tuner section for FM broadcast comprises an RF amplifier 122 for FM broadcast, a converter 112, an IF limiter amplifier 113, an FM detector circuit 114 and a stereophonic demodulation circuit 115, whereas the AM tuner section for the AM broadcast comprises an RF amplifier 123 for AM broadcast, a converter 116, an IF amplifier 117 provided with an AGC function and an AM detector circuit 119.

On the other hand, the tuner section 110 of the FM tuner type keyless entry system comprises an RF amplifier 124 for the keyless entry system, a converter 112, an IF limiter amplifier 113 and an FM detector circuit 114, whereas the tuner section of the AM tuner type keyless entry system comprises an RF amplifier 124 for the keyless entry system, a converter 116, an IF limiter amplifier 113 and an AM detector circuit 119.

Thus, by combining the tuner of the keyless entry system and the FM/AM tuner of the broadcast audio system into an unit, they can be realized in the form of a single chip IC.

In other words, the keyless entry system, be it an FM tuner type of an AM tuner type, shares the converter 112 and the IF limiter amplifier 113 of the FM tuner of the broadcast audio system. Additionally, only selectors 111, 112d, 113 and an OSC 112c for the keyless entry system are arranged in the tuner section 110 as additional components.

Thus, it will be appreciated that a receiver according to the invention provides a significant reduction in the number of components and hence in the manufacturing cost if compared with that of a keyless entry system and that of an automobile audio system arranged independently in an automobile.

While the embodiment of receiver according to the invention is applicable to both an FM tuner type keyless entry system and an AM tuner type keyless entry system, it may be so modified as to make it applicable only to either an FM tuner type keyless entry system or an AM tuner type keyless entry system. If it is made applicable only to an FM tuner type keyless entry system, the selector 118 in FIG. 11 can be removed.

While a radio wave is used as means for transmitting signals between the transmitter (the door key) and the receiver (the automobile), it may be needless to say that it can be replaced by a light wave or an IR beam.

Figure 12:
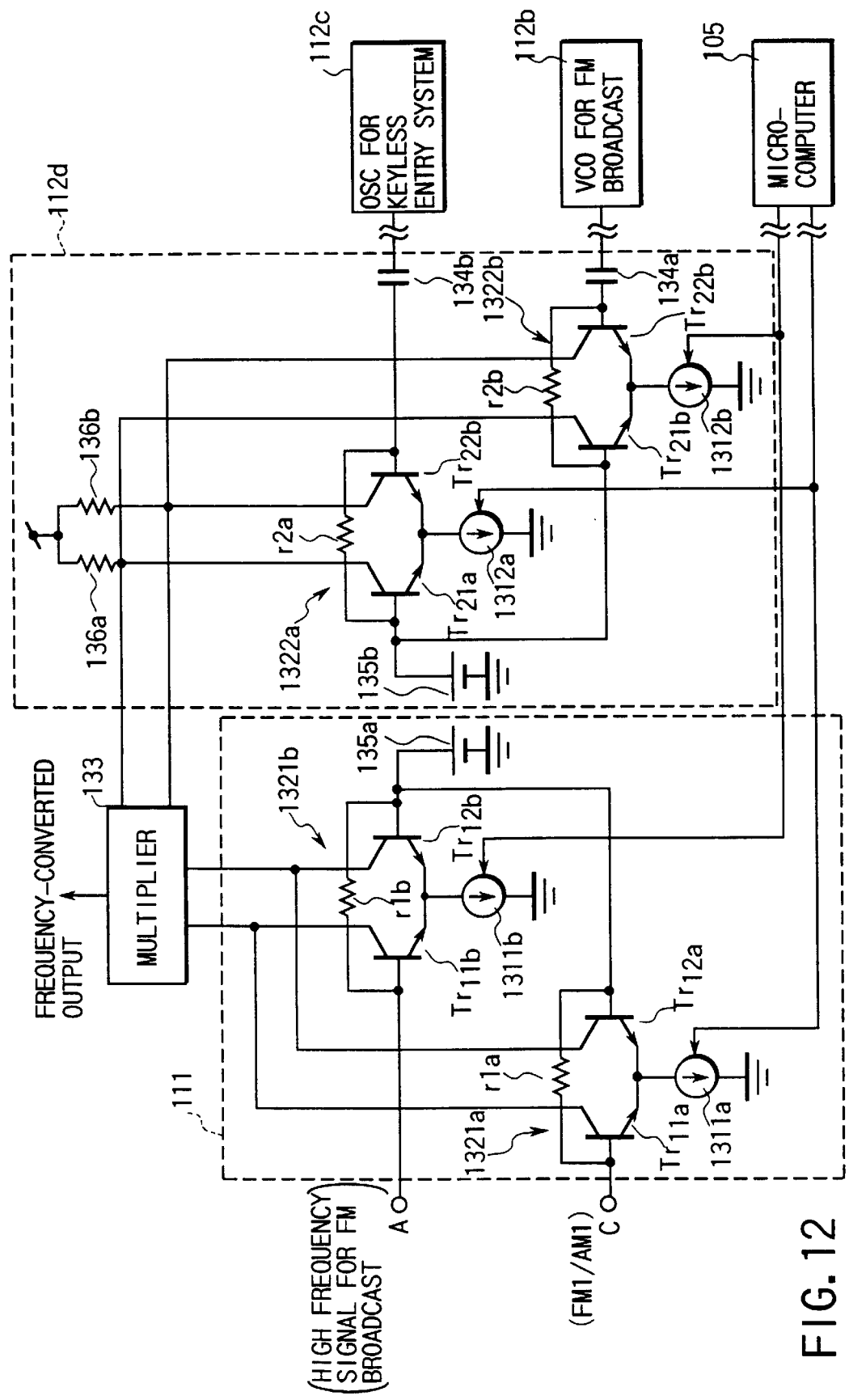
FIG. 12 is a schematic circuit diagram of some of the selectors and the converters of FIG. 11.

FIG. 12 shows in detail the configuration of the selector 111 and the converter 112 in FIG. 11. Now, the selector 111 and the converter 112 of the embodiment will be described in terms of configuration by referring to FIGS. 11 and 12.

The selector 111 comprises a pair of bipolar transistors Tr11a, Tr12a forming a differential pair 1321a, a resistor r1a, a current source 1311a, a pair of bipolar transistors Tr11b, Tr12b forming another differential pair 1321b, a resistor r1b, a current source 1311b and a power source 135a.

The selector 112d comprises a pair of bipolar transistors Tr21a, Tr22a forming a differential pair 1322a, a resistor r2a, a current source 1312a, a pair of bipolar transistors Tr21b, Tr22b forming another differential pair 1322b, a resistor r2b, a current source 1312b, capacitors 134a, 134b and resistors 136a, 136b.

The mixer 112a comprises a multiplier 133.

Each of the current sources 1311a, 1311b, 1312a, 1312b is turned on/off according to a control signal output from the microcomputer 105. In the selector 111, when either of the current sources 1311a, 1311b is turned on, the other is turned off. Similarly, in the selector 112d, when either of the current sources 1312a, 1312b is turned on, the other is turned off. When the current source 1311a of the selector 111 is turned on, the current source 1312a of the selector 112d is also turned on, whereas, when the current source 1311b of the selector 111 is turned on, the current source 1312b of the selector 112d is also turned on.

For example, the operation of switching the current sources 1311a, 1311b, 1312a, 1312b can be performed according to if the door key is inserted into the ignition key insertion slot or not. Thus, when the door key is not inserted into the ignition key insertion slot, the current sources 131a, 1312a are turned on to activate the keyless entry system, whereas, when the door key is inserted into the ignition key insertion slot, the current sources 1311b, 1312b are turned on to inactivate the keyless entry system.

Alternatively, the operation of switching the current sources 1311a, 1311b, 1312a, 1312b can be performed by recognizing the current status of the automobile audio system. Thus, when the switch of the automobile audio system is turned off, the current sources 1311a, 1312a are turned on to activate the keyless entry system, whereas, when the switch of the automobile audio system is turned on, the current sources 1311b, 1312b are turned on to inactivate the keyless entry system.

Still alternatively, the operation of switching the current sources 1311a, 1311b, 1312a, 1312b can be performed by recognizing the signal wave transmitted from the door key.

Meanwhile, the tuner section is so arranged as to be fed with power constantly so that the keyless entry system may be operational when the automobile audio system is off. It may be needless to say that the keyless entry system may be so arranged as to remain operational when the automobile audio system is on.

When the current sources 1311a, 1312a are held on under the control of the microcomputer 105, the FM signal wave FM1 or the AM signal wave AM1 that has been amplified for high frequency amplification is fed to the differential pair 1321a, while the output signal of the OSC 112c for the keyless entry system is fed to the differential pair 1322a by way of the capacitor 134b. The multiplier 133 generates an output signal (IF signal) as a result of frequency conversion according to the output signals of the differential pairs 1321a, 1322a.

When, on the other hand, the current sources 1311b, 1312b are held on under the control of the microcomputer 105, the high frequency signal for FM broadcast that has been amplified for high frequency amplification is fed to the differential pair 1321b, while the output signal of the VCO 112b for FM broadcast is fed to the differential pair 1322b by way of the capacitor 134a. The multiplier 133 generates an output signal (IF signal) as a result of frequency conversion according to the output signals of the differential pairs 1321b, 1322b.

Figure 13:
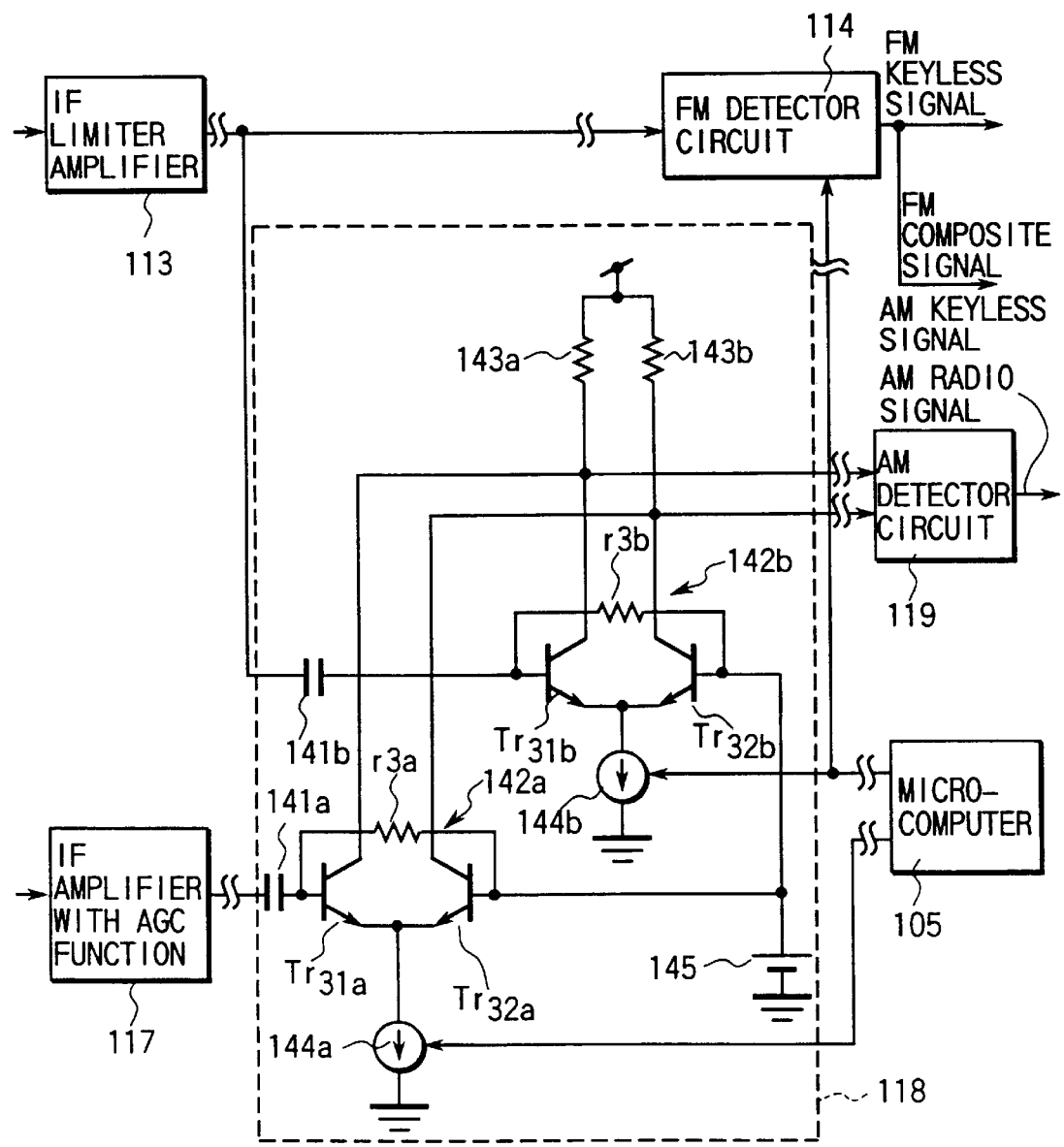
FIG. 13 is a schematic circuit diagram of another one of the selectors of FIG. 11.

FIG. 13 is a schematic block diagram of the selector 118 in FIG. 11. Now, the selector 118 will be described in detail for its configuration by referring to FIGS. 11 and 13.

The selector 118 comprises a pair of bipolar transistors Tr31a, Tr32a forming a differential pair 142a, a resistor r3a, a current source 144a, a pair of bipolar transistors Tr31b, Tr32b forming another differential pair 142b, a resistor r3b, a current source 144b, capacitors 141a, 141 and resistors 143a, 143b.

Each of the current sources 144a, 144b is turned on/off according to a control signal output from the microcomputer 105. Thus, the current source 144a is turned on to activate the automobile audio system, whereas the current source 144b is turned on to activate the keyless entry system.

The operation of switching the current sources 144a, 144b is performed substantially simultaneously with the operation of switching the current sources 1311a, 1311b, 1312a, 1312b of the selectors 111, 112d. The switching operation may alternatively be performed by recognizing if the door key is inserted into the ignition key insertion slot or not or by recognizing the current status (on, off) of the automobile audio system. Still alternatively, it may be performed by recognizing if a signal wave is output from the door key or not.

Meanwhile, the tuner section is so arranged as to be fed with power constantly so that the keyless entry system may be operational when the automobile audio system is off.

Additionally the keyless entry system may be so arranged as to remain operational when the automobile audio system is on.

When the current source 144a is held on under the control of the microcomputer 105, the output signal of the IF amplifier 117 provided with an AGC function is fed to the differential pair 142a by way of the capacitor 141a. Thus, the signal receiving route of the tuner for AM broadcast is activated. The output signal of the differential pair 142a is fed to the AM detector circuit 119, which generates an AM radio signal.

When, on the other hand, the current source 144b is held on under the control of the microcomputer 105, the output signal of the IF limiter amplifier 113 is fed to the differential pair 142b by way of the capacitor 141b. Thus, the IF signal obtained as a result of frequency conversion of the AM signal for the keyless entry system is selected. The output signal of the differential pair 142b is fed to the AM detector circuit 119, which generates an AM keyless signal.

Figure 14:
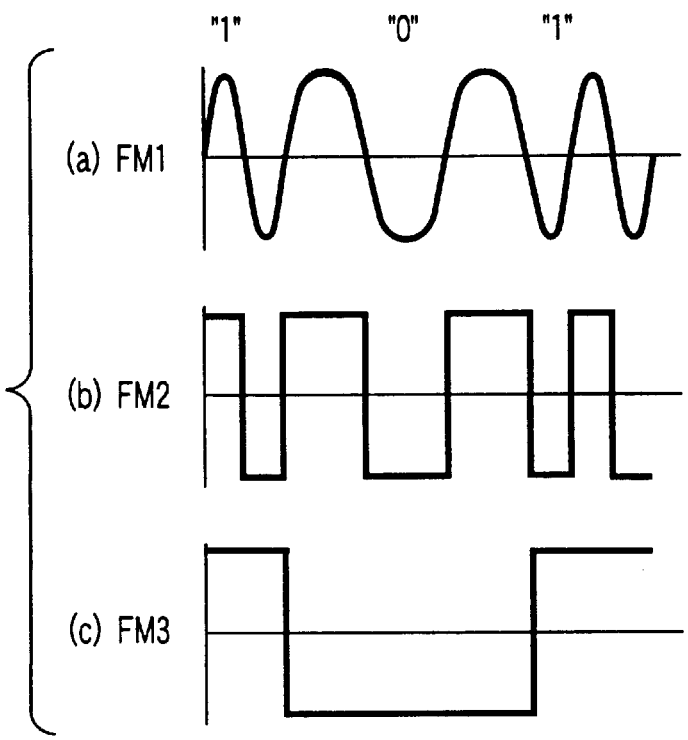
FIG. 14 is a graph showing signal waveforms at different nodes that can be observed in an FM tuner type system.

FIG. 14 is a graph showing signal waveforms at different nodes that can be observed when the receiver of FIGS. 9 through 13 is used as FM/AM tuner of an automobile audio system and also as FM tuner of a keyless entry system.

FM signal wave FM1 output from the transmitter contained in the door key has a waveform as indicated by (a) in FIG. 14. The frequency peaks of the waveform may be used to represent data "1" whereas the frequency bottoms of the waveform may be used to represent data "0".

The FM signal wave FM1 is then amplified by the RF amplifier of the keyless entry system for high frequency amplification and then converted into an IF signal by the converter 12. The IF signal is then amplified and subjected to an amplitude limiting operation by the IF limiter amplifier to produce an IF signal FM2 having a waveform as indicated by (b) in FIG. 14.

The IF signal FM2 output from the IF limiter amplifier is then detected by the FM detector circuit, which by turn produces a FM keyless signal FM3 having a waveform as indicated by (c) in FIG. 14.

Figure 15:
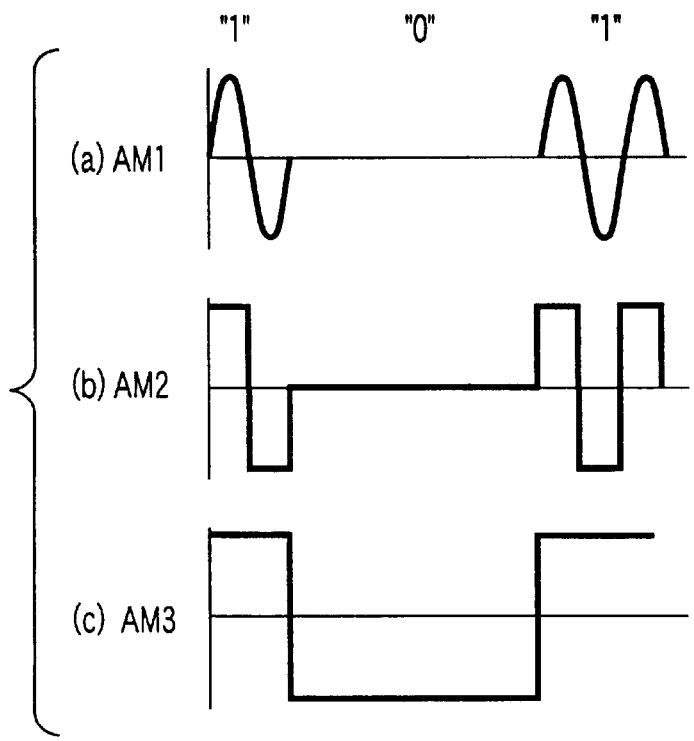
FIG. 15 is a graph showing signal waveforms at different nodes that can be observed in an AM tuner type system.

FIG. 15 is a graph showing signal waveforms at different nodes that can be observed when the receiver of FIGS. 9 through 13 is used as FM/AM tuner of an automobile audio system and also as AM tuner of a keyless entry system.

AM signal wave AM1 output from the transmitter contained in the door key has a waveform as indicated by (a) in FIG. 15. The portions where a wave exists may be used to represent data "1" whereas the portions where no wave exists may be used to represent data "0".

The AM signal wave AM1 is then amplified by the RF amplifier of the keyless entry system for high frequency amplification and then converted into an IF signal by the converter 12. The IF signal is then amplified and subjected to an amplitude limiting operation by the IF limiter amplifier to produce an IF signal AM2 having a waveform as indicated by (b) in FIG. 15.

The IF signal AM2 output from the IF limiter amplifier is then detected by the AM detector circuit, which by turn produces a AM keyless signal FM3 having a waveform as indicated by (c) in FIG. 15.

Thus, with a receiver according to the invention, the tuner of the keyless entry system is combined with the FM/AM tuner of the automobile audio system into a unit, which is realized in the form of a single chip that operates as a common tuner section of the two systems.

The keyless entry system, be it an FM tuner type or an AM tuner type, shares the converter and the IF limiter amplifier of the automobile audio system. Only the additional components of the tuner section that are attributable to the keyless entry system are the selector and the OSC.

Thus, a receiver according to the invention can significantly reduce the number of components and hence the manufacturing cost when used in an automobile equipped with a keyless entry system and an automobile audio system.

Additionally, in the case of an AM tuner type keyless entry system, the IF limiter amplifier of the FM tuner section is used to operate the keyless entry system in order to realize a high gain AM tuner for the keyless entry system.

If the keyless entry system has both an FM tuner and an AM tuner and they are combined with the FM/AM tuner of an automobile audio system, the unified tuner will no longer be affected by the modulation mode (FM signal wave, AM signal wave) of the transmitter of the door key. It may be needless to say that only either the FM tuner or the AM tuner of the keyless entry system may be combined with the FM/AM tuner of the automobile audio system.

Finally, while separate antennas are provided to receive an FM/AM signal wave for the keyless entry system and an FM/AM broadcast wave in the above embodiment, they may be unified into a single antenna. If such is the case, the glass antenna for receiving an FM broadcast wave in the VHF band is modified to show frequency characteristics adapted to cover an UHF band up to 430 MHz that is used in the keyless entry system.

(2) Now, a crystal oscillator according to the invention and a receiver comprising such a crystal oscillator will be described by referring to the accompanying drawing.

Figure 16:
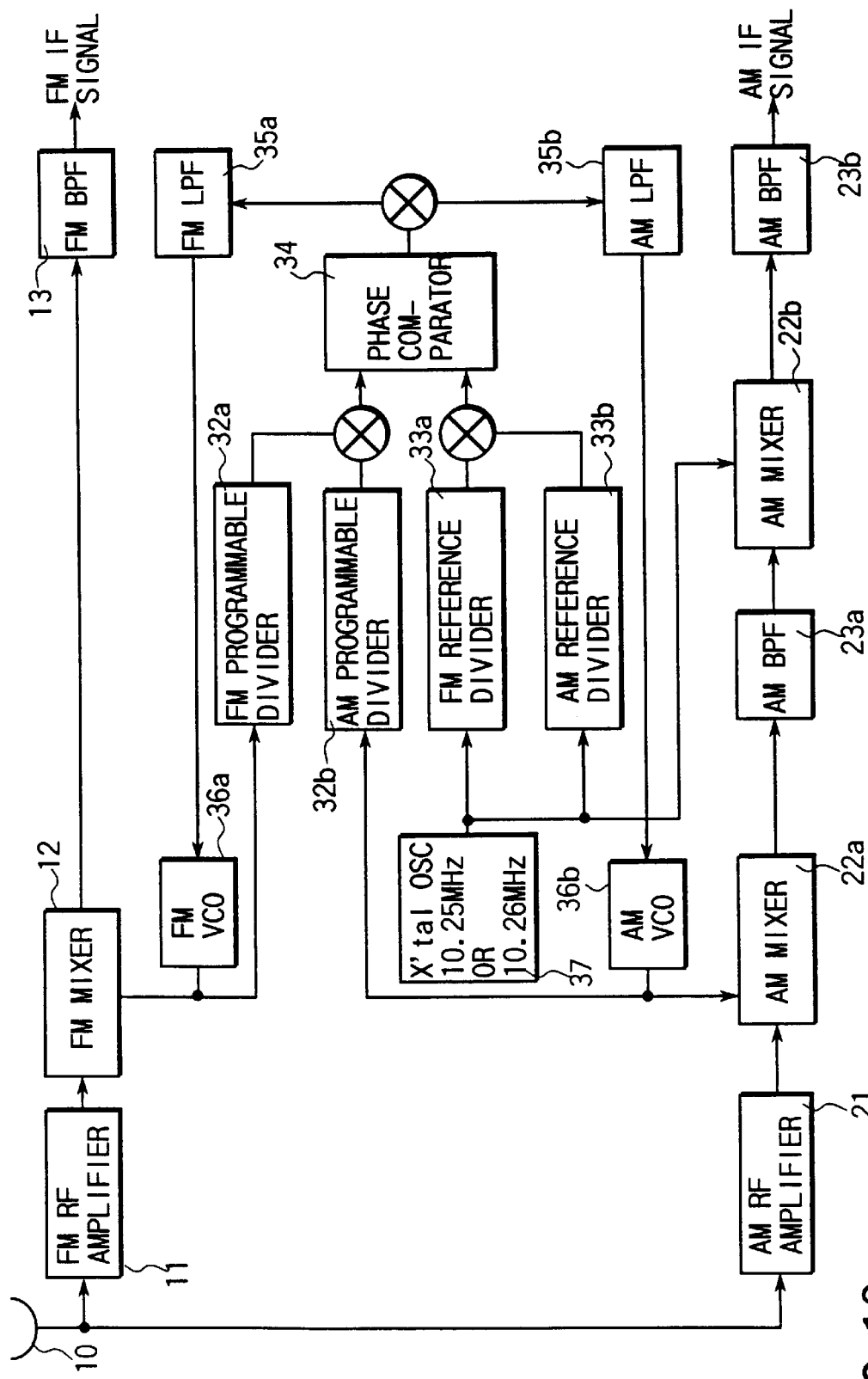
FIG. 16 is a schematic block diagram of a principal part of a radio receiver according to the invention.

FIG. 16 is a schematic block diagram of a principal part of a radio receiver according to the invention.

The radio receiver comprises an FM tuner, an AM tuner and a PLL circuit contained in a single chip to realize a one-chip IC configuration.

The FM tuner includes an RF (radio frequency) amplifier 11, a mixer 12 and a band-pass filter 13.

The high frequency signal received by the antenna 10 is fed to and amplified by the RF amplifier 11. The output of the RF amplifier 11 is then fed to the mixer 12 for station selection. The output of the mixer 12 is turned into an IF (intermediate frequency) signal as it passes through the band-pass filter 13.

The AM tuner includes an RF amplifier, mixers 22a, 22b, band-pass filters 23a, 23b and a crystal oscillator 24.

The high frequency signal received by the antenna 10 is fed to and amplified by the RF amplifier 21. The output of the RF amplifier 21 is then fed to the mixer 22a for station selection. The output of the mixer 22a is fed to the mixer 22b by way of the band-pass filter 23a, where it is subjected to frequency conversion. The mixer 22b is fed with a clock generated by the crystal oscillator 24. The output of the mixer 22b is turned into an IF signal as it passes through the band-pass filter 23b.

The PLL circuit 31 for station selection includes an FM programmable divider 32a, an AM programmable divider 32b, an FM reference divider 33a, an AM reference divider 33b, a phase comparator 34, low-pass filters 35a, 35b, VCOs (voltage controlled oscillators) 36a, 36b and a crystal oscillator 24.

The crystal oscillator 24 generates a clock having a predetermined frequency and the FM reference divider 33a and the AM reference divider 33b generates signals having respective frequencies on the basis of the clock having the predetermined frequency and generated by the crystal oscillator 24.

The AM tuner of this embodiment of radio receiver is of an up-conversion type that typically up-coverts the received radio wave to 10.7 or 10.71 MHz and subsequently down-converts it to 45 KHz and the crystal oscillator 24 applies a clock of 10.25 MHz or 10.26 MHz to the mixer 22b.

A single crystal oscillator is shared by the AM tuner and the PLL circuit for station selection in this embodiment for the purpose of reducing the manufacturing cost so that each of the reference dividers 33a, 33b generates a clock having a desired frequency by means of the clock of 10.25 MHz or 10.26 MHz.

Figure 17:
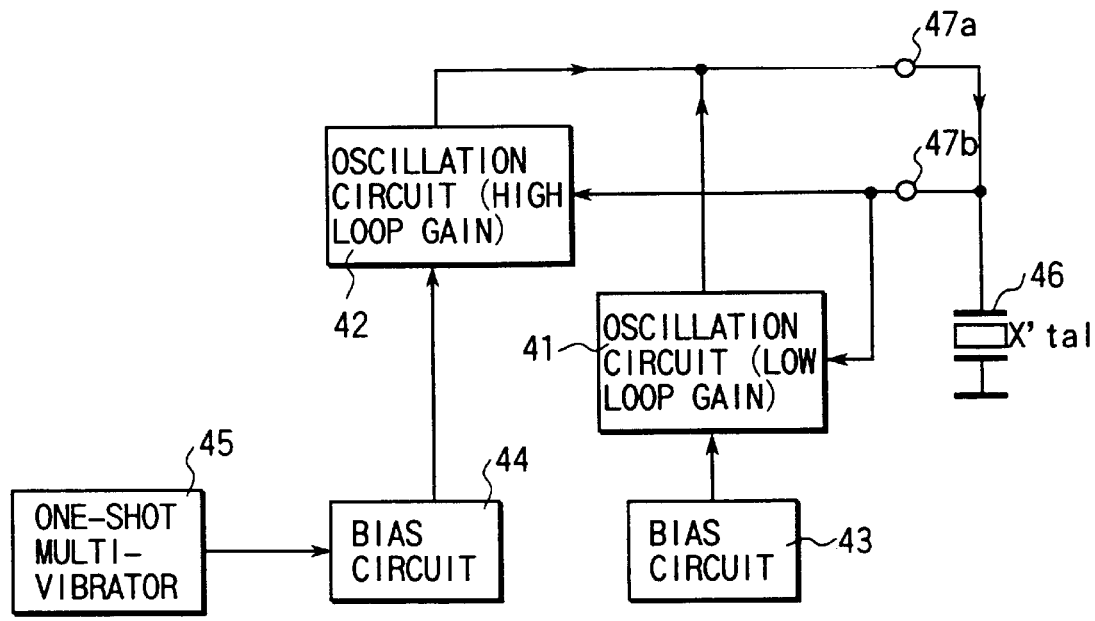
FIG. 17 is a schematic block diagram of a first embodiment of crystal oscillator that can be used for the purpose of the invention.

FIG. 17 is a schematic block diagram of a first embodiment of crystal oscillator that can be used for the purpose of the invention. This crystal oscillator may typically be used for a radio receiver as shown in FIG. 16.

Referring to FIG. 17, reference numeral 41 denotes an oscillation circuit having a low loop gain and reference numeral 42 denotes an oscillation circuit having a high loop gain. The output terminal of the oscillation circuit 41 having a low loop gain and that of the oscillation circuit 42 having a high loop gain are coupled together and connected to a crystal 46 by way of output pin 47a of the IC (chip). Similarly, the input terminal of the oscillation circuit 41 having a low loop gain and that of the oscillation circuit 42 having a high loop gain are coupled together and connected to the crystal 46 by way of input pin 47b of the IC (chip).

Bias circuit 43 biases the oscillation circuit 41 having a low loop gain, whereas bias circuit 44 biases the oscillation circuit 42 having a high loop gain. The bias circuit 44 of the oscillation circuit 42 having a high loop gain is connected to an one-shot multi-vibrator 45, which one-short multi-vibrator 45 activates the bias circuit 44 when the system is started and inactivates the bias circuit 44 thereafter. Thus, the oscillation circuit 42 having a high loop gain is activated at the time when the system is started but will be inactivated subsequently.

As described above, with the embodiment of crystal oscillator, both the oscillation circuit 41 having a low loop gain and the oscillation circuit 42 having a high loop gain are activated at the start of the system and, thereafter, only the oscillation circuit 41 having a low loop gain remains active.

Since a crystal oscillator having a configuration as described above comprises an oscillation circuit with a low loop gain and an oscillation circuit with a high loop gain, of which the oscillation circuit with a high loop gain is activated only at the start of the system. The system is made to remain mute at the very start until it gets to a stabilized state so that it would not output any reception signal. This is the reason why it is possible to realize a one-chip IC containing AM and FM tuners and a PLL circuit for station selection in it.

Figure 18:
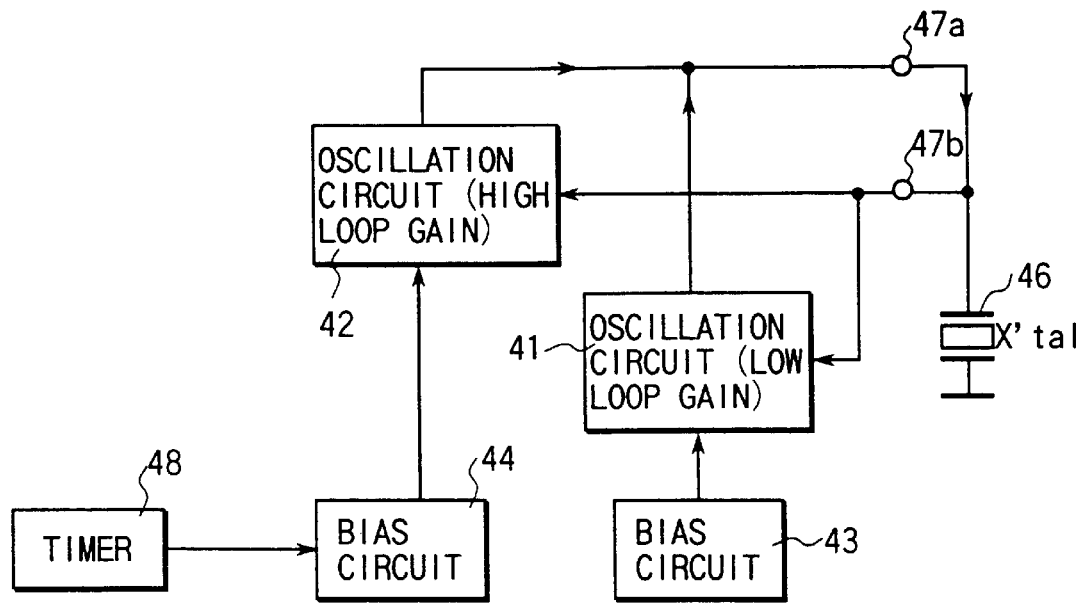
FIG. 18 is a schematic block diagram of a second embodiment of crystal oscillator that can be used for the purpose of the invention.

FIG. 18 is a schematic block diagram of a second embodiment of crystal oscillator that can be used for the purpose of the invention. This crystal oscillator may also be used for a radio receiver as shown in FIG. 16.

Referring to FIG. 18, reference numeral 41 denotes an oscillation circuit having a low loop gain and reference numeral 42 denotes an oscillation circuit having a high loop gain. The output terminal of the oscillation circuit 41 having a low loop gain and that of the oscillation circuit 42 having a high loop gain are coupled together and connected to a crystal 46 by way of output pin 47a of the IC (chip). Similarly, the input terminal of the oscillation circuit 41 having a low loop gain and that of the oscillation circuit 42 having a high loop gain are coupled together and connected to the crystal 46 by way of input pin 47b of the IC (chip).

Bias circuit 43 biases the oscillation circuit 41 having a low loop gain, whereas bias circuit 44 biases the oscillation circuit 42 having a high loop gain. The bias circuit 44 of the oscillation circuit 42 having a high loop gain is connected to a timer 48, which timer 48 is operates by a control clock fed from a microcomputer (in a separate IC) to activate the bias circuit 44 when the system is started and inactivate the bias circuit 44 thereafter. Thus, the oscillation circuit 42 having a high loop gain is activated at the time when the system is started but will be inactivated subsequently.

As described above, with this embodiment of crystal oscillator, both the oscillation circuit 41 having a low loop gain and the oscillation circuit 42 having a high loop gain are activated at the start of the system and, thereafter, only the oscillation circuit 41 having a low loop gain remains active.

Since a crystal oscillator having a configuration as described above comprises an oscillation circuit with a low loop gain and an oscillation circuit with a high loop gain, of which the oscillation circuit with a high loop gain is activated only at the start of the system. The system is made to remain mute at the very start until it gets to a stabilized state so that it would not output any reception signal. This is the reason why it is possible to realize a one-chip IC containing AM and FM tuners and a PLL circuit for station selection in it.

Additionally, the user can select an appropriate duration of time (a predetermined period of time from the start of the system) for which the oscillation circuit 42 having a high loop gain is activated so that the crystal oscillator 46 may operate stably regardless of its quality and if the crystal 46 has a large start-up resistance.

Figure 19:
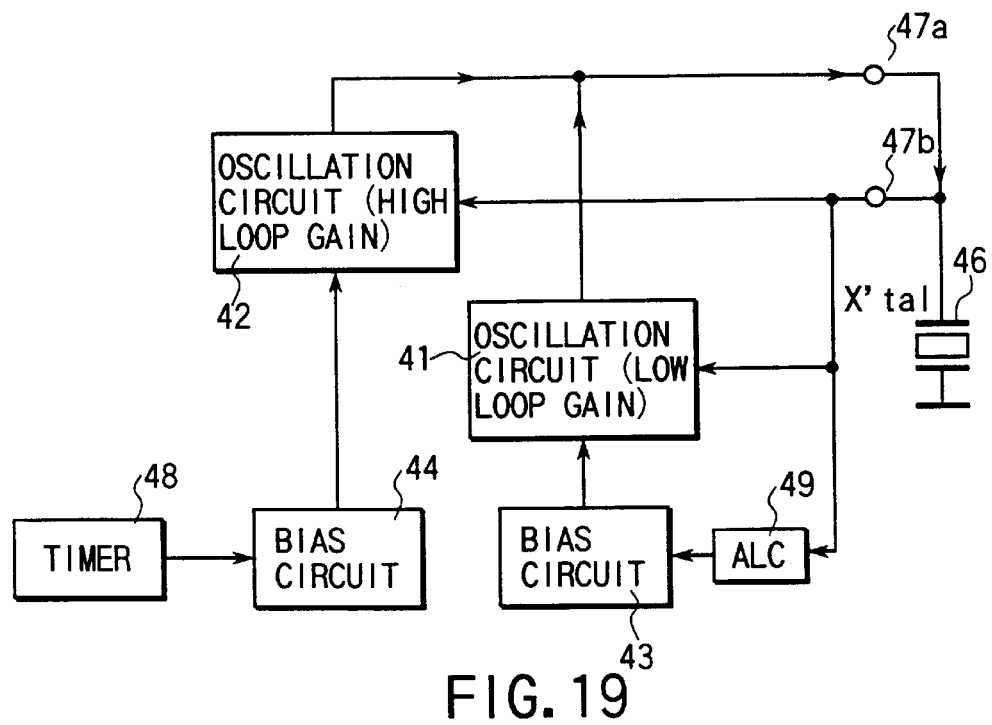
FIG. 19 is a schematic block diagram of a third embodiment of crystal oscillator that can be used for the purpose of the invention.

FIG. 19 is a schematic block diagram of a third embodiment of crystal oscillator that can be used for the purpose of the invention. This crystal oscillator may also be used for a radio receiver as shown in FIG. 16.

Referring to FIG. 19, reference numeral 41 denotes an oscillation circuit having a low loop gain and reference numeral 42 denotes an oscillation circuit having a high loop gain. The output terminal of the oscillation circuit 41 having a low loop gain and that of the oscillation circuit 42 having a high loop gain are coupled together and connected to a crystal 46 by way of output pin 47a of the IC (chip). Similarly, the input terminal of the oscillation circuit 41 having a low loop gain and that of the oscillation circuit 42 having a high loop gain are coupled together and connected to the crystal 46 by way of input pin 47b of the IC (chip).

Bias circuit 43 biases the oscillation circuit 41 having a low loop gain, whereas bias circuit 44 biases the oscillation circuit 42 having a high loop gain. The bias circuit 44 of the oscillation circuit 42 having a high loop gain is connected to a timer 48, which timer 48 is operates by a control clock fed from a microcomputer (in a separate IC) to activate the bias circuit 44 when the system is started and inactivate the bias circuit 44 thereafter. Thus, the oscillation circuit 42 having a high loop gain is activated at the time when the system is started but will be inactivated subsequently.

As described above, with this embodiment of crystal oscillator, both the oscillation circuit 41 having a low loop gain and the oscillation circuit 42 having a high loop gain are activated at the start of the system and, thereafter, only the oscillation circuit 41 having a low loop gain remains active.

Additionally, an ALC (automatic level controller) 49 is connected to the bias circuit 43 of the oscillation circuit 41 having a low loop gain. The input terminal of the ALC 49 is connected to the crystal 46 by way of the input pin 47b of the IC. The ALC 47b suppresses variations in the oscillation amplitude due to the variations in the equivalent series resistance of the crystal 46 and hence it suppresses variations in the level of the higher harmonic signal.

Since a crystal oscillator having a configuration as described above comprises an oscillation circuit with a low loop gain and an oscillation circuit with a high loop gain, of which the oscillation circuit with a high loop gain is activated only at the start of the system. The system is made to remain mute at the very start until it gets to a stabilized state so that it would not output any reception signal. This is the reason why it is possible to realize a one-chip IC containing AM and FM tuners and a PLL circuit for station selection in it.

Additionally, the user can select an appropriate duration of time (a predetermined period of time from the start of the system) for which the oscillation circuit 42 having a high loop gain is activated so that the crystal oscillator 46 may operate stably regardless of its quality and if the crystal 46 has a large start-up resistance.

Still additionally, the ALC suppresses variations in the oscillation amplitude due to the variations in the equivalent series resistance of the crystal 46 and hence it suppresses variations in the level of the higher harmonic signal.

Figure 20:
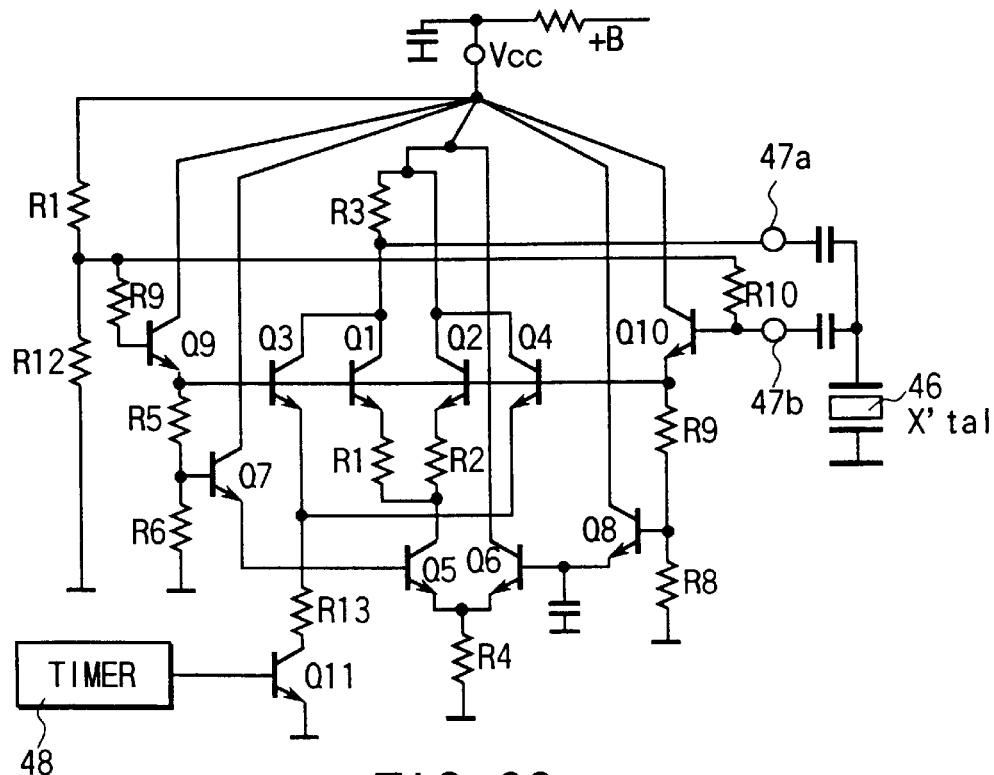
FIG. 20 is a schematic circuit diagram of a first embodiment of circuit that can be used for the crystal oscillator of FIG. 18.

FIG. 20 is a schematic circuit diagram of a fourth embodiment of oscillation circuit according to the invention. It is based on the oscillator of FIG. 19.

A pair of npn-type bipolar transistors Q1, Q2 that constitute a differential pair forms an oscillation circuit having a low loop gain. Another pair of npn-type bipolar transistors Q3, Q4 that also constitute a differential pair forms an oscillation circuit having a high loop gain. The emitter of the transistor Q1 is connected to the collector of an npn-type bipolar transistor Q by way of a resistor R1 and the emitter of the transistor Q2 is also connected to the collector of the npn-type bipolar transistor Q5 by way of a resistor R2. The emitters of npn-type bipolar transistors Q5, Q6 that constitute a differential pair are connected to the grounding terminal of the circuit by way of a resistor R4.

The emitters of the transistors Q3, Q4 are connected to the collector of an npn-type bipolar transistor Q11 by way of a resistor R13. The output signal of the timer 48 is applied to the base of the transistor Q11, the emitter of which is connected to the grounding terminal of the circuit. The collectors of the transistors Q1, Q3 operates as output terminals of the respective oscillators and connected to the output pin 47a of the IC.

The timer 48 controls the on/off operation of the transistor Q11. More specifically, the timer keeps the transistor Q11 on for a predetermined period of time after the start of the system. During this time, the differential pair of the transistors Q3, Q4 is biased and activated. Thus, the differential pair of the transistor Q3, Q4 is virtually connected in parallel with the differential pair of the transistors Q3, Q4 to raise the loop gain of the oscillator circuit.

When the predetermined period of time has passed since the start of the system, the timer 48 turns off the transistor Q11 so that the differential pair of the transistors Q3, Q4 is no longer biased and becomes inactivated. Thus, the loop gain of this oscillation circuit is lower under this condition than that of the circuit when the differential pair of the transistors Q3, Q4 is active.

At this time, the ALC suppresses variations in the level of the higher harmonic signal.

According to the invention, the oscillation circuit is made to show a high loop gain for a predetermined period of time after the start of the system and show a low loop gain after that predetermined period has passed.

Thus, an oscillator and a receiver comprising such an oscillator according to the invention provide the following advantages.

Firstly, the cost of the master clock can be reduced.

A crystal having a large start-up resistance can be used to provide an oscillation on a stable basis regardless of the type of the crystal.

Since the degree of higher harmonics of the master clock (10.25 MHz or 10.26 MHz) is low during the steady-state oscillation after the start of the system, they would not interferes with any signals in the FM reception band.

Secondly, no frequency offset will occur for the second IF signal in the double conversion type tuner and hence the sensitivity to AM signals would not be degraded. This is mainly due to the use of a master clock.

Figure 21:
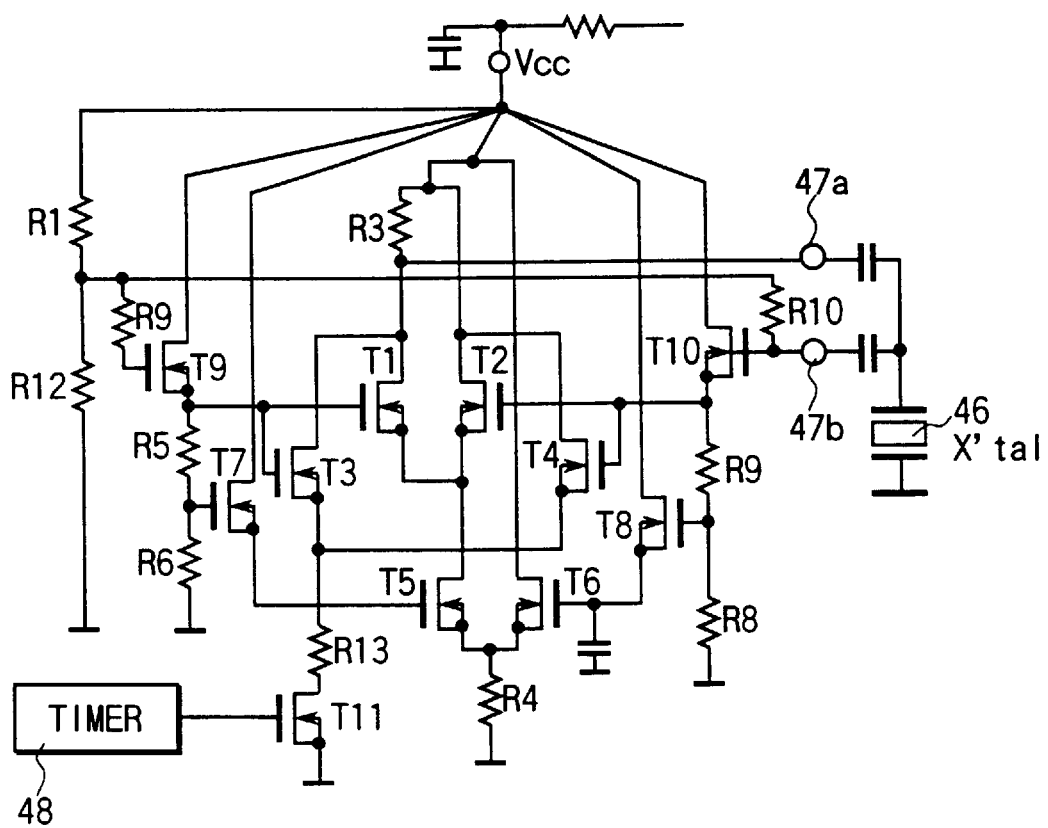
FIG. 21 is a schematic circuit diagram of a second embodiment of circuit that can be used for the crystal oscillator of FIG. 18.

FIG. 21 is a schematic circuit diagram of a fifth embodiment of oscillation circuit according to the invention. It is based on the oscillator of FIG. 19.

A pair of MOS transistors T1, T2 that constitute a differential pair forms an oscillation circuit having a low loop gain. Another pair of MOS transistors T3, T4 that also constitute a differential pair forms an oscillation circuit having a high loop gain. The conductance gm of the MOS transistors T3, T4 has a value greater than the conductance gm of the MOS transistors T1, T2.

The source of the MOS transistor T1 is connected to the drain of a MOS transistor T5 and the source of the MOS transistor T2 is also connected to the drain of the MOS transistor T5. The sources of MOS transistors T5, T6 that constitute a differential pair are connected to the grounding terminal of the system by way of a resistor R4.

The sources of the transistors T3, T4 are connected to the drain of a MOS transistor T11 by way of a resistor R13. The output signal of timer 48 is applied to the base of the MOS transistor T11, the source of which is connected to the grounding terminal of the system. The drains of the MOS transistors T1, T3 operate as output terminal of the oscillator and connected to the output pin 47a of the IC.

The timer 48 controls the on/off operation of the MOS transistor T11. More specifically, the timer keeps the MOS transistor T11 on for a predetermined period of time after the start of the system. During this time, the differential pair of the MOS transistors T3, T4 is biased and activated. Thus, the differential pair of the MOS transistors T3, T4 is virtually connected in parallel with the differential pair of the transistors T3, T4 to raise the loop gain of the oscillator circuit.

When the predetermined period of time has passed since the start of the system, the timer 48 turns off the MOS transistor T11 so that the differential pair of the MOS transistors T3, T4 is no longer biased and becomes inactivated. Thus, the loop gain of this oscillation circuit is lower under this condition than that of the circuit when the differential pair of the MOS transistors T3, T4 is active.

According to the invention, the oscillation circuit is made to show a high loop gain for a predetermined period of time after the start of the system and show a low loop gain after that predetermined period has passed.

Thus, an oscillator and a receiver comprising such an oscillator according to the invention provide the advantages described above by referring to the first embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A receiver comprising:

an FM tuner having an FM mixer for converting the frequency of an FM signal;

a double conversion type AM tuner having a first AM mixer for up-converting the frequency of an AM signal and down-converting the frequency of the AM signal; and a PLL circuit having a crystal oscillator, a first VCO for generating an output signal to be applied to said FM mixer on the basis of the outcome of comparing the output signal of said crystal oscillator and that of said FM mixer and a second VCO for generating an output signal to be applied to said first AM mixer on the basis of the outcome of comparing the output signal of said crystal oscillator and that of said first AM mixer;

wherein said crystal oscillator includes a first oscillation circuit, a second oscillation circuit having a loop gain higher than the first oscillation circuit and a control circuit for activating at least said second oscillation circuit for a predetermined period of time after the start and inactivating said second oscillation circuit after the predetermined period of time, while keeping said first oscillation circuit activated;

the output terminals of said first and second oscillation circuits being connected commonly and positively fed back.

2. A receiver according to claim 1, wherein said control circuit is constituted by a one-shot multivibrator for controlling the operation of the bias circuits adapted to bias said first and second oscillation circuits respectively.

3. A receiver according to claim 1, wherein said control circuit is constituted by a timer for controlling the operation of the bias circuits adapted to bias said first and second oscillation circuits respectively.

4. A receiver according to claim 1, wherein said first oscillation circuit is controlled by an ALC (automatic level controller).

5. A receiver according to claim 1, wherein said first and second oscillation circuits are constituted by differential amplifiers.

6. A receiver according to claim 1, wherein said FM tuner, said AM tuner and said PLL circuit are contained in a single chip.

* * * * *